United States Patent [19]
Suzuki et al.

[11] Patent Number: 5,990,698
[45] Date of Patent: Nov. 23, 1999

[54] TEST METHOD AND APPARATUS FOR SEMICONDUCTOR ELEMENT

[75] Inventors: Kouichi Suzuki; Sadanobu Sato; Yumiko Yamashita; Hisamasa Yano, all of Tokyo, Japan

[73] Assignee: NEC Corporation, Tokyo, Japan

[21] Appl. No.: 08/796,122

[22] Filed: Feb. 6, 1997

[30] Foreign Application Priority Data

Feb. 9, 1996 [JP] Japan .................................. 8-023820

[51] Int. Cl.$^6$ .................................................. G01R 31/26
[52] U.S. Cl. ........................................... 324/766; 324/551
[58] Field of Search .............................. 324/766, 158.1, 324/527, 537, 541, 551, 765, 767

[56] References Cited

U.S. PATENT DOCUMENTS

| | | | |
|---|---|---|---|
| 4,636,724 | 1/1987 | Fukuda et al. | 324/527 |
| 4,806,857 | 2/1989 | Inamura et al. | 324/541 |
| 4,812,755 | 3/1989 | Toshiyuki et al. | 324/537 |
| 4,823,088 | 4/1989 | Fukuda | 324/765 |
| 5,159,369 | 10/1992 | Hashimoto | 324/537 |
| 5,523,699 | 6/1996 | Miyagawa | 324/765 |
| 5,594,349 | 1/1997 | Kimura | 324/551 |
| 5,675,260 | 10/1997 | Consiglio | 324/158.1 |

FOREIGN PATENT DOCUMENTS

| | | |
|---|---|---|
| 0245115 | 11/1987 | European Pat. Off. . |
| 2259585 | 10/1990 | Japan . |
| 315773 | 1/1991 | Japan . |
| 04020882 | 1/1992 | Japan . |
| 05188120 | 7/1993 | Japan . |
| 5180899 | 7/1993 | Japan . |
| 63275968 | 7/1993 | Japan . |
| 7325119 | 12/1995 | Japan . |

*Primary Examiner*—Ernest Karlsen
*Attorney, Agent, or Firm*—Whitham, Curtis & Whitham

[57] ABSTRACT

It is intended to provide a test method and a test apparatus for determining breakdown strength which are not affected by statistic capacity in measurement environment or the like, and can be applied to any semiconductor elements. A capacitor with known capacitance is connected to a semiconductor element, and voltage is applied to the capacitor to charge and discharge it. It is detected whether or not the semiconductor element is broken down at the moment of discharge. Either one of charge or energy injected in charging and discharging is calculated from the capacitance and voltage at the moment of breakdown, and the result of calculation is determined as the breakdown strength.

6 Claims, 2 Drawing Sheets

TEST METHOD AND APPARATUS FOR SEMICONDUCTOR ELEMENT

BACKGROUND OF THE INVENTION

1. Field of the Invention

The present invention relates to a test method and apparatus for a semiconductor element such as MOS or bipolar transistor, and, more particularly, a test method and apparatus for determining breakdown strength through a destructive test.

2. Description of the Prior Art

Generally, a test method for such semiconductor element employs a one described in Japanese Patent Application Laid-Open No. 2-259585, 3-15773 or 5-180899. All of these methods measure a breakdown voltage of a semiconductor element to be tested by charging voltage generated from a variable voltage supply in a capacitor with a certain capacity, changing over the capacitor to the semiconductor, and discharging the capacitor. In this case, the variable voltage supply applies a high voltage of 1000–5000V. It is common to all test methods that breakdown strength of a semiconductor element tested by such test method is represented by breakdown voltage or dielectric breakdown voltage. These test are called as breakdown test or destructive tests.

Here, it should be taken into account that the capacity of the semiconductor element largely varies between a state as a semiconductor wafer and a state as packaged in a package, and depending on the measurement environment and measurement instrument. As well known, since relationship of $Q=CV$ or $V=Q/C$ is established between charge $Q$ charged in the semiconductor element, voltage $V$ to be applied, and the capacity $C$, if the capacity varies in testing, breakdown voltage representing the result of test cannot be said to indeed represent an accurate value unless the relationship with the capacity is indicated.

On the other hand, the semiconductor element is generally categorized into a MOS semiconductor device and a bipolar semiconductor device. Breakdown strength of the MOS semiconductor device is mainly determined by breakdown strength of the insulating film, while that of the bipolar semiconductor device is mainly determined by breakdown strength of PN junction. Furthermore, depending on the structure or size of the semiconductor device, in many cases, the breakdown strength of the insulating film of MOS semiconductor device is represented by breakdown strength when charge in a capacitor of 1–10 pF is discharged, while the breakdown strength of PN junction is represented by breakdown strength when charge in a capacitor of 100–1000 pF is discharged. In any case, it is necessary to vary the capacity over a wide range to determine the breakdown strength of the semiconductor element. When such variation of capacity over a wide range is taken into consideration, it is obvious that the conventional test methods cannot determine accurate breakdown strength for each semiconductor element.

An object of the present invention is to provide a test method to accurately determine semiconductor element breakdown strength.

Another object of the present invention is to provide a test method for semiconductor element which can be commonly applied to various semiconductor elements.

Still another object of the present invention is to provide a test apparatus for semiconductor element which can calculate breakdown strength.

BRIEF SUMMARY OF THE INVENTION

One aspect of the present invention can provide a test method for semiconductor element comprising the steps of charging a capacitor with known capacitance, discharging it to a semiconductor element to be tested, whereby a destructive test is conducted on the semiconductor element to determine at least one of amount of charge and energy when the semiconductor element is broken down as breakdown strength of the semiconductor element. In this case, the breakdown strength can be determined by calculating charge and energy injected in charging and discharging. In addition, the test is conducted several times on the same semiconductor element to determine whether the breakdown strength of the semiconductor element is represented by amount of charge or energy.

Another aspect of the present invention can provide a test method for semiconductor element comprising the steps of charging a first capacitor with known capacitance by applying a first voltage, discharging it to a first semiconductor element, whereby a first destructive test is conducted on the first semiconductor element, preparing a second semiconductor element with the same arrangement as the first semiconductor element and a second capacitor with capacitance different from the first capacitor, conducting a second destructive test on the second semiconductor element by charging and discharging the second capacitor, whereby breakdown strength is determined with either one of amount of charge or energy by referencing the results of the first and second breakdown tests.

In addition, another aspect of the present invention can provide a test apparatus for conducting a destructive test on a semiconductor element, the test apparatus comprising a conductor plate capable of mounting the semiconductor element thereon and maintained at a predetermined potential, variable voltage generation means for generating voltage applied to the semiconductor element, and varying the voltage, variable capacity means containing capacity value 0 for determining capacity for charging and discharging the semiconductor element, and a switch turning the semiconductor to charged state through the variable capacity means by the variable voltage means, followed by turning the semiconductor element to discharged state.

BRIEF DESCRIPTION OF THE DRAWINGS

This above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
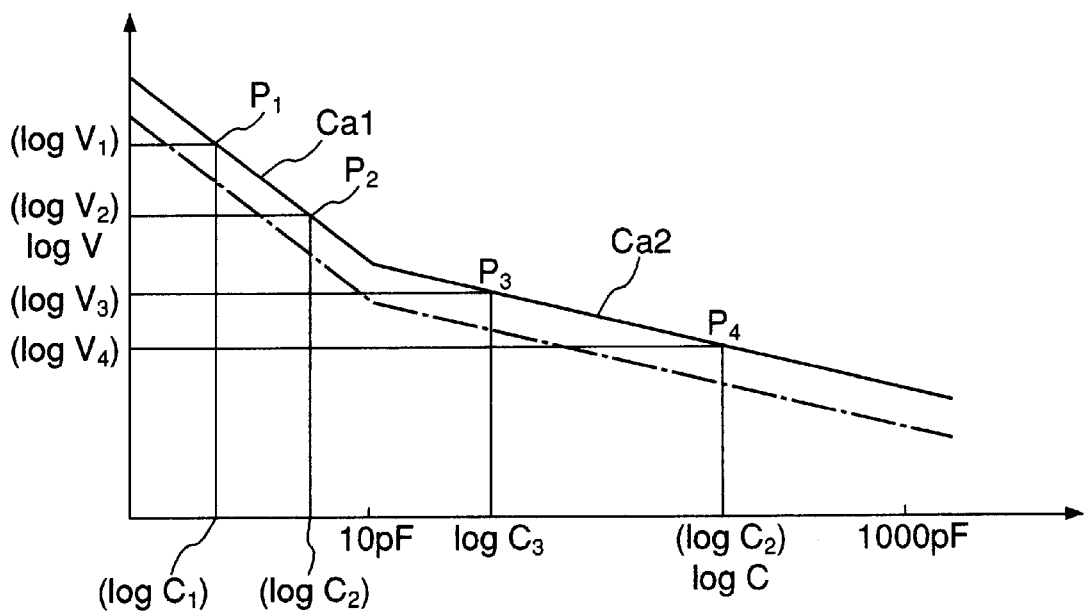
FIG. 1 is a graph illustrating the principle of the present invention which represents the relationship between voltage V and capacitance.

Referring to FIG. 1, the principle of the present invention is described by using the relationship between capacitance C and breakdown voltage V. This graph shows capacitance C in a range of 0–1000 pF and breakdown voltage V in the form of log C and log V on the axis of abscissa and the axis of ordinate.

First, when a high voltage V of 1000–3000 volt is applied to a semiconductor device through capacitance C of about 3–10 pF, and discharged, the semiconductor device is broken down in voltage mode breakdown, which often occurs in an insulating film such as a gate oxide film if the semiconductor device is an MOSIC. The voltage mode breakdown is determined by voltage on the area being broken down, for example, the gate oxide film due to the high voltage V externally applied.

Here, it is assumed that, when a breakdown test is conducted on a semiconductor device (called a "first semiconductor device"), breakdown in voltage mode occurs at capacitance C1 and voltage V1. In addition, it is assumed that, when a similar breakdown test is conducted on a semiconductor device with the same arrangement (called a "second semiconductor device") in a state where the capacitance C1 is changed to different capacitance C2, breakdown in voltage mode occurs at voltage V2. When these values are plotted on the graph shown in FIG. 1, points P1 and P2 are obtained, and a straight line Ca 1 is obtained by connecting the points P1 and P2.

On the other hand, as well known in the art, the relationship between the capacitance C and the voltage V in the voltage mode can be represented by Q=CV by using amount of charge Q. This equation can be modified to V=Q/C. Amount of charge Q1 and Q2 at the points P1 and P2 are represented by Q1=C1V1 and Q2=C2V2, respectively. As described above, since the first and second semiconductor devices have the same arrangement, the amount of charge Q1 and Q2 until the voltage mode breakdown occurs should be equal to each other. Therefore, it is found through study by the inventors that breakdown strength of the first and second semiconductor devices with the same arrangement can be determined by the amount of charge Q.

On the graph of FIG. 1, the amount of charge Q1 and Q2 until the voltage mode breakdown occurs are represented by points on the straight line Ca 1. The inclination of straight line Ca 1 characterizes that the result of breakdown test is the voltage mode breakdown. Therefore, the fact that the result of breakdown test is the voltage mode breakdown can be detected by measuring the inclination of straight line Ca 1.

Actually, since there is slight variation in the first and second semiconductor devices, it is sufficient to statistically determine a center point from distribution of the point P1 and distribution of the point P2 by preparing a plurality of semiconductor devices with the same arrangement, and conducting the breakdown test on them.

As described, by representing the breakdown strength of a semiconductor device with the amount of charge Q, it can be represented by a value independent from the value of capacitance.

Furthermore, when the breakdown test is conducted by applying a voltage V on a semiconductor device through capacitance C in a range of 10 pF to 1000 pF, it is known that breakdown of the semiconductor device is caused from heat generated by high current flowing through, for example, a bipolar semiconductor device in charging and discharging. Therefore, the inventors have found that, in such a case, if energy (J) injected in the semiconductor device is determined as the breakdown strength when the semiconductor device is broken down, the breakdown strength can be accurately and uniquely determined when compared to a case where the breakdown voltage is determined as the breakdown strength.

Specifically, when the semiconductor device is broken down by applying the voltage V on the semiconductor device through the capacitance C, energy E (J) can be represented as E=(½) $CV^2$, which can be modified as V=√2 √(E/C). Therefore, when a specific semiconductor device is broken down by performing charge and discharge in a state where a voltage V3 is applied to the semiconductor device through a capacitance C3, a point P3 in FIG. 1 can be determined. Similarly, when a semiconductor device with the same arrangement is broken down by applying a voltage V4 to it through a capacitance C4, a point P4 can be determined. Energy E1 and E2 (J) at the points P3 and P4 can be represented by E1=(½) $C1V1^2$ and E2=(½) $C2V2^2$, respectively.

Here, since the semiconductor devices tested have the same arrangement, and should be broken down with the same energy, E1=E2 can be established. In addition, when the capacitance and voltage described above are represented by the relationship between log C and log V as shown in FIG. 1, a straight line Ca 2 can be obtained as shown in FIG. 1.

The inclination of the straight line Ca 2 characterizes energy (J) injected when breaking a semiconductor device. This inclination obviously differs from that of the straight line Ca 1.

Therefore, it can be easily determined whether the breakdown strength should be represented as the amount of insulation by amount of charge or energy by calculating the inclination of the straight lines Ca 1 and Ca 2.

Thus, when amount of charge Q (coulomb) or energy (J) is determined as breakdown strength by identifying the breakdown mode, a very reasonable value can be presented to a user than in a case where the breakdown strength is determined by breakdown voltage.

In addition, when the points P3 and P4 are actually determined, it is same as in the case of points P1 and P2 that the breakdown test is conducted on a plurality of semiconductor devices in a state where the capacitance C3 or C4 is fixed to measure the breakdown voltage and to statistically determine each point.

Furthermore, although the illustrated example is described for a case where the magnitude of inclination is detected to identify whether each point is on the straight line Ca 1 or Ca 2, it is possible to identify where each point is on the straight line Ca 1 or Ca 2 by placing at least three points on the graph.

Figure 2:
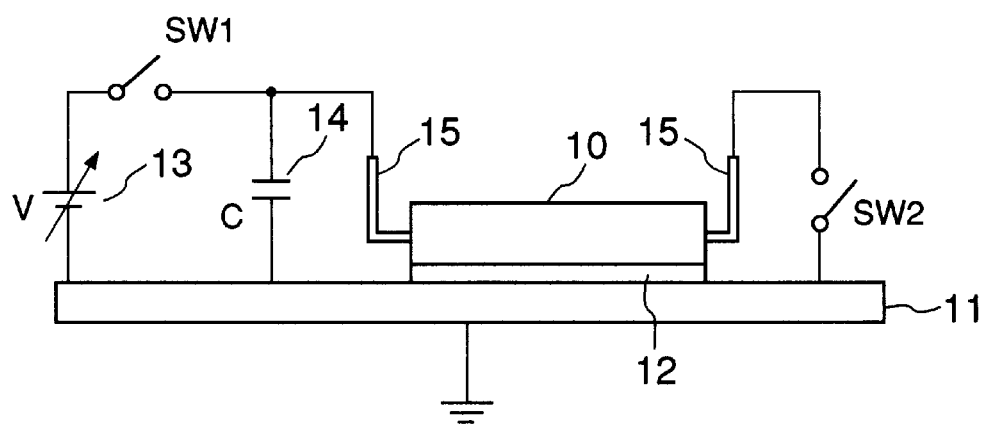
FIG. 2 is a schematic diagram showing the arrangement of a test apparatus according to one embodiment of the present invention.

Referring to FIG. 2, a test apparatus according to one embodiment of the present invention is schematically described. First, in FIG. 2, a test is assumed to be conducted on a semiconductor device 10 packaged in a package and having a plurality of leads 15 extending outside the package.

The test apparatus illustrated provides a conductor plate 11 maintained at a predetermined potential (here, grounded), on which a insulator plate 12 is mounted. As illustrated, since the semiconductor device 10 is placed on the insulating plate 12, capacitance between the semiconductor device 10 and the conductor plate 11 can be substantially ignored.

In addition, the test apparatus has a voltage source 13 the voltage of which can be varied over a range of 100V–3000V, and which has a negative electrode connected to the conductor plate 11 and the positive electrode connected to one terminal of a capacitor 14 and one lead 15 of the semiconductor device 10 through a switch SW 1. Another terminal of the capacitor 14 is connected to the conductor plate 11, as illustrated, and the other lead 15 of the semiconductor device 10 is connected to the conductor plate 11 through a switch SW 2.

Here, the capacitor 14 may be a variable capacitor the capacitance of which can be varied, or capacitors with known capacity may be switchably connected. In any way, capacitance C of the capacitor 14 is varied over a range of 1 pF–1000 pF during testing.

Referring to FIG. 2, operation of the test apparatus is described. It is assumed that a MOS semiconductor device breakdown strength of which is determined by an insulating film is tested as the semiconductor device. In this case, first, a capacitor with known capacitance C is connected as the capacitor 14. Here, it is assumed that the capacitor 14 with relatively low capacitance, for example, about 3 pF as the known capacitance C is connected.

Then, when the switch SW 1 is closed while the switch SW 2 is opened, the capacitor 14 is charged for a predetermined duration by a voltage V from the voltage supply 13. Under this state, charge Q charged in the capacitor 14 can be calculated from values of the capacitance C and the voltage V.

When charging of the capacitor 14 completes as the predetermined duration expires, the switch SW 1 is opened, and the switch SW 2 is closed. This applies a voltage corresponding to the voltage V applied during charging to the semiconductor device 10, and the charge Q charged in the capacitor 14 is discharged through the lead 15 of the semiconductor device 10 and the switch SW 2. Under the discharged state of the capacitor 14, a tester (not shown) measures whether or not the semiconductor device 10 is broken down. When the measurement indicates that the semiconductor device 10 is not broken down, similar operation is repeated by raising the voltage V of the voltage supply 13.

Consequently, when breakdown of the semiconductor device 10 is detected, amount of charge Q is calculated from the capacitance C of the capacitor 14 and the voltage V at the moment when the semiconductor device is broken down, and can be determined as breakdown strength of the semiconductor device 10.

On the other hand, when the amount of charge Q is calculated from the relationship between the capacitance C and the voltage V, as shown in FIG. 1, a semiconductor device with similar arrangement to the semiconductor device 10 is prepared. The capacitance C is changed to, for example, 10 pF. The breakdown test is repeated as in the case of the capacitor 14 of 3 pF to derive the relationship between the capacitance C and the voltage V at the moment of breakdown, whereby the inclination of the straight line Ca 1 of FIG. 1 is determined by also utilizing the capacitance C and the voltage V in the previous breakdown test. Thus, it is possible to determine whether the breakdown test shows breakdown occurring at a constant amount of charge.

While, for the above example, the description is given as the amount of charge Q is calculated by conducting the breakdown test on a single semiconductor device, actually, a number of semiconductor devices with the same arrangement are prepared for respective capacitance C, and voltage at the moment of breakdown is determined statistically or in average from distribution of voltage V when these semiconductor devices are broken down.

Now, description is given a case where a bipolar semiconductor device breakdown strength of which depends on a PN junction is tested by a test apparatus shown in FIG. 2. In this case, a relatively high capacitance C of, for example, about 50 pF is connected as the capacitor 14. Under this state, a breakdown test is conducted on the bipolar semiconductor device as in the MOS semiconductor device by varying the voltage V of the voltage supply 13.

In this case, as described earlier, breakdown of the bipolar semiconductor device is mainly determined by breakdown strength of the PN junction. Since this means that the bipolar semiconductor device is broken down as current actually flows through it, it is reasonable that breakdown strength is determined by calculating energy E (J) when discharging the capacitor 14.

Taking this fact into account, when a bipolar semiconductor device is tested, energy E (J) varying along the straight line Ca 2 of FIG. 1 is calculated, and the energy E, the result of calculation, is determined as the breakdown strength. As already described in conjunction with FIG. 1, since the energy E is represented as $E=(½) CV^2$, it may be allowed to find the energy E from the capacitance C and the voltage V at breaking down, and to determine it as the breakdown strength.

On the other hand, as described with reference to FIG. 1, the capacitance C of the capacitor 14 is varied, for example, from 50 pF to 1000 pF. A similar breakdown test is conducted at 1000 pF to determine a breakdown voltage V. The inclination of the straight line Ca 2 is found from the relationship between the capacitance C and the breakdown voltage V at the moment, and between those from the previous test to calculate the inclination of the straight line Ca 2. Difference between it and the inclination of the straight line Ca 1 is calculated, so that the breakdown is determined to be caused by breakdown of the PN junction. Here, the switch SW 1 used in charging is not necessarily required, and may be replaced with, for example, a resistor of 1–10 MΩ.

While, in conjunction with FIG. 2, description is given only the case where the semiconductor device packaged is subject to the breakdown test, the test apparatus according to the present invention can be applied to a case where a semiconductor wafer is tested.

Figure 3:
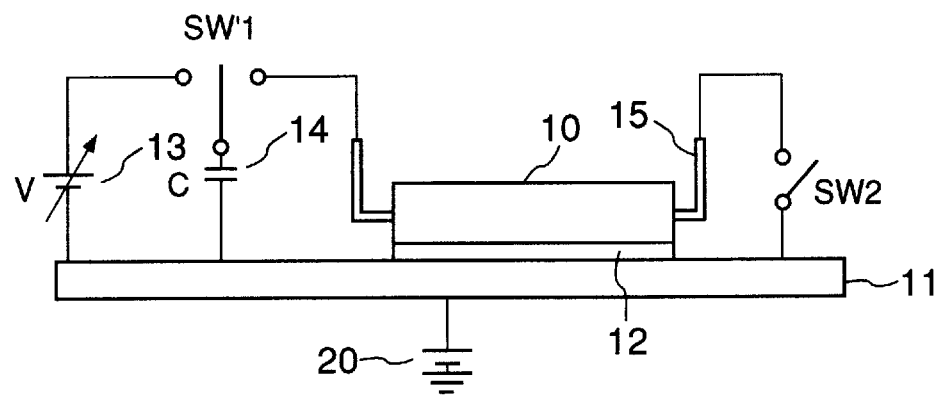
FIG. 3 is a schematic diagram illustrating a variation of the test apparatus shown in FIG. 2.

Referring to FIG. 3, a variation of the test apparatus shown in FIG. 2 is described. A test apparatus shown in FIG. 3 differs from the test apparatus shown in FIG. 2 in that it provides a transfer switch SW 1' directly connected to the capacitor 14, and a direct current supply 20 connected to the conductor plate 11. Thus, the capacitor 14 may be charged and discharged by maintaining potential of the conductor plate 11 at a predetermined potential with voltage from the direct current supply 20, and changing over the transfer switch SW 1' between the voltage supply 13 and the semiconductor device 10.

Also with the arrangement, as in the case of FIG. 2, the capacitor 14 is charged, and then discharged by changing over the transfer switch SW 1' to the semiconductor device 10. Thus, breakdown strength of the semiconductor device 10 can be represented by amount of charge or energy.

Figure 4:
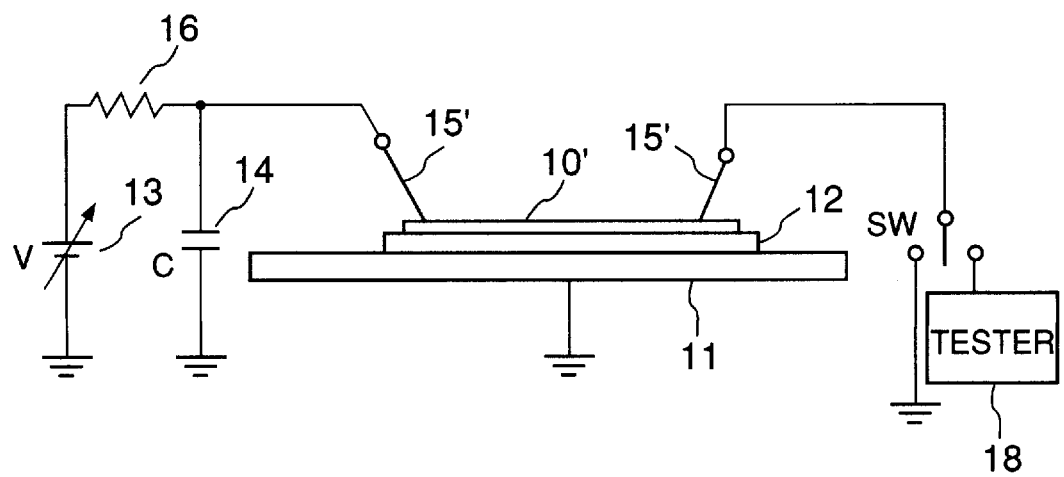
FIG. 4 is a schematic diagram showing the arrangement of a test apparatus according to another embodiment of the present invention.

Referring to FIG. 4, a test apparatus according to another embodiment of the present invention connects a resistor of 1–10 MΩ between the voltage supply 13 and the capacitor 14 in place of the switch SW 1 of FIG. 2, and has an insulating plate 12 on which a semiconductor wafer 10' is mounted. In this example, there is provided only a switch SW which is closed when the capacitor 14 is discharged. In addition, the test can be efficiently conducted by constituting the illustrated switch SW with a transfer switch which selectively changes over between the ground potential and a tester 18.

This test apparatus provides a probe 15' for electrically contacting an electrode on the semiconductor wafer 10'. The probe 15' is used to apply voltage V and for discharging the capacitor 14. Also with the illustrated test apparatus, as in FIG. 2, the capacitor 14 is charged in a state where the switch SW is disconnected from the ground potential, and discharged by connecting the switch SW to the ground potential after completion of charging. After completion of discharging, the switch SW is changed over to the tester 18 to detect whether or not breakdown occurs in the semiconductor wafer 10'. Then, breakdown strength can be represented by either amount of charge or energy at the moment of breakdown.

In this case, it may be arranged to cause the probe 15' to connect in parallel to a plurality of discharging electrodes on the semiconductor wafer 10' so that state on the plurality of electrodes can be simultaneously tested.

Here, the semiconductor device 10 shown in FIG. 2 and the semiconductor wafer 10' shown in FIG. 4, as well as a semiconductor chip, a printed circuit board, an IC card, and a liquid crystal panel are collectively called the semiconductor element.

For the above-mentioned embodiments, although description is given only a case where the breakdown strength of the semiconductor element is determined, whether a semiconductor element is acceptable or defective can be determined by charging the capacitor 14 with rated voltage defined for each semiconductor element, and monitoring the state of a plurality of leads 15 and the electrode in discharging.

Furthermore, although, for FIGS. 2–4, the description is given as capacitance in the semiconductor element, the switch and the insulating plate 12 can be ignored, if charge in the semiconductor element cannot be ignored, such capacitance and breakdown strength can be determined by measuring amount of charge after application of voltage with a charge measurement method described in Japanese Patent Application Laid Open No. 7-325119, and by taking the result of measurement into account.

As described above, the test apparatus and method according to the present invention are advantageous in that breakdown strength of a semiconductor element can be accurately represented with unique amount not depending on measurement environment or the like. In addition, the present invention is also advantageous in that it can determine breakdown strength with a test method common to every semiconductor devices, and can be applied to determination of acceptability of a semiconductor element.

What is claimed is:

1. A test method for determining the breakdown strength of a semiconductor element, comprising the steps of:
    charging a capacitor having a known capacitance with a voltage source having a known voltage;
    discharging said capacitor to a semiconductor element undergoing a breakdown test to cause said semiconductor element to break down;
    calculating at least one of amount of charge and energy based on said known capacitance and said known voltage when said semiconductor element is broken down to determine a breakdown strength of said semiconductor element.

2. The test method as set forth in claim 1, wherein said breakdown test is conducted on the same semiconductor element a plurality of times to determine whether the breakdown strength of the semiconductor element is represented by amount of charge or energy.

3. A test method for semiconductor element comprising the steps of:
    charging a first capacitor with known capacitance by applying a first voltage;
    discharging said capacitor to a first semiconductor element so that a first breakdown test is conducted on said first semiconductor element;
    charging a second capacitor with known capacitance, different than said first capacitance, with a second voltage;
    discharging said second capacitor to a second semiconductor element so that a second breakdown test is conducted on said second semiconductor element;
    plotting first and second points on a log-log graph, where said first and second capacitances are plotted on the axis of abscissa and where said first voltage and said second voltage are plotted on the axis of ordinate; and
    determining whether said breakdown strength depends on charge or energy by an inclination angle of a straight line connecting said first and said second points.

4. A test apparatus for conducting a breakdown test on a semiconductor element, said test apparatus comprising:
    a conductor plate capable of mounting said semiconductor element thereon and maintained at a predetermined potential;
    variable voltage generation means for generating voltage applied to said semiconductor element, and varying said voltage;
    a variable capacitor for changing the capacitance for charging and discharging said semiconductor element;
    a switch turning said semiconductor element to a charged state through said variable capacitor by said variable voltage generation means, followed by turning said semiconductor element to a discharged state to determine a breakdown voltage and a breakdown capacitance; and
    means for calculating charge and energy as breakdown strength of said semiconductor element from said breakdown voltage and said breakdown capacitance.

5. A method for determining breakdown strength of like semiconductor devices expressed in terms of breakdown strength, comprising the steps of:
    charging a capacitor having a first capacitance with a variable voltage source;
    discharging said capacitor to a first semiconductor device under test;
    increasing said variable voltage source and repeating said charging and discharging steps until said first semiconductor device under test fails;
    plotting said first capacitance verses voltage at which said first semiconductor device under test fails on a logarithmic graph to obtain a first point;
    charging a capacitor having a second capacitance with said variable voltage source;
    discharging said capacitor to a second semiconductor device under test, said first and said second semiconductor devices under test being like devices;
    increasing said variable voltage source and repeating said charging and discharging steps until said second semiconductor device under test fails;
    plotting said second capacitance verses a voltage at which said second semiconductor device under test fails on said logarithmic graph to obtain a second point, wherein each of said first point and said second point represent breakdown strength of said first and said second semiconductor devices in terms of a charge in coulombs (Q).

6. A method for determining breakdown strength of a semiconductor device as recited in claim 5, further comprising the step of:
    determining a slope of a straight line drawn between said first point and said second point to determine an energy level in Joules (J) at which said like semiconductor devices fail.

* * * * *